United States Patent
Chen

Patent Number: 6,096,250
Date of Patent: Aug. 1, 2000

[54] PROCESS FOR RELEASING A RUNNER FROM AN ELECTRONIC DEVICE PACKAGE ON A LAMINATE PLATE

[75] Inventor: Shih-Li Chen, Hsinchu Hsien, Taiwan

[73] Assignee: Caesar International, Inc., San Jose, Calif.

[21] Appl. No.: 09/036,093

[22] Filed: Mar. 6, 1998

[51] Int. Cl.[7] .................................................. B29C 37/02
[52] U.S. Cl. ........................... 264/130; 264/161; 264/276
[58] Field of Search .............................. 264/161, 272.11, 264/272.17, 275, 276, 130, 39; 29/840, 841, 850; 205/120, 135, 157

[56] References Cited

U.S. PATENT DOCUMENTS

| | | | |
|---|---|---|---|
| 5,151,276 | 9/1992 | Sato et al. | 425/110 |
| 5,458,716 | 10/1995 | Alfaro et al. | 156/245 |
| 5,542,171 | 8/1996 | Juskey et al. | 264/276 |
| 5,635,671 | 6/1997 | Freyman et al. | 174/52.2 |
| 5,637,723 | 6/1997 | Goo | 264/272.15 |
| 5,961,912 | 10/1999 | Huang et al. | 264/272.15 |

Primary Examiner—Angela Ortiz

[57] ABSTRACT

A process for releasing a runner or gate from an electronic device on a laminate plate after molding process is included. The area of the laminate plate designed to be covered with molding compound is cleaned in advance by appropriate physical and chemical process to enhance the adhesion property, and the area to be covered by the runner or gate is protected from the cleaning process to maintain the original property of low adhesion to the laminate plate. The runner or gate can be easily released from the laminate plate without damage to the molding compound after the molding process, and the yield of the electronic device is increased.

2 Claims, 11 Drawing Sheets

PROCESS FOR RELEASING A RUNNER FROM AN ELECTRONIC DEVICE PACKAGE ON A LAMINATE PLATE

FIELD OF THE INVENTION

The present invention relates to a molding process of electronic devices such as ICs, and more particularly, to a process for easily releasing the runner or gate from the electronic device package.

BACKGROUND OF THE INVENTION

Figure 1:
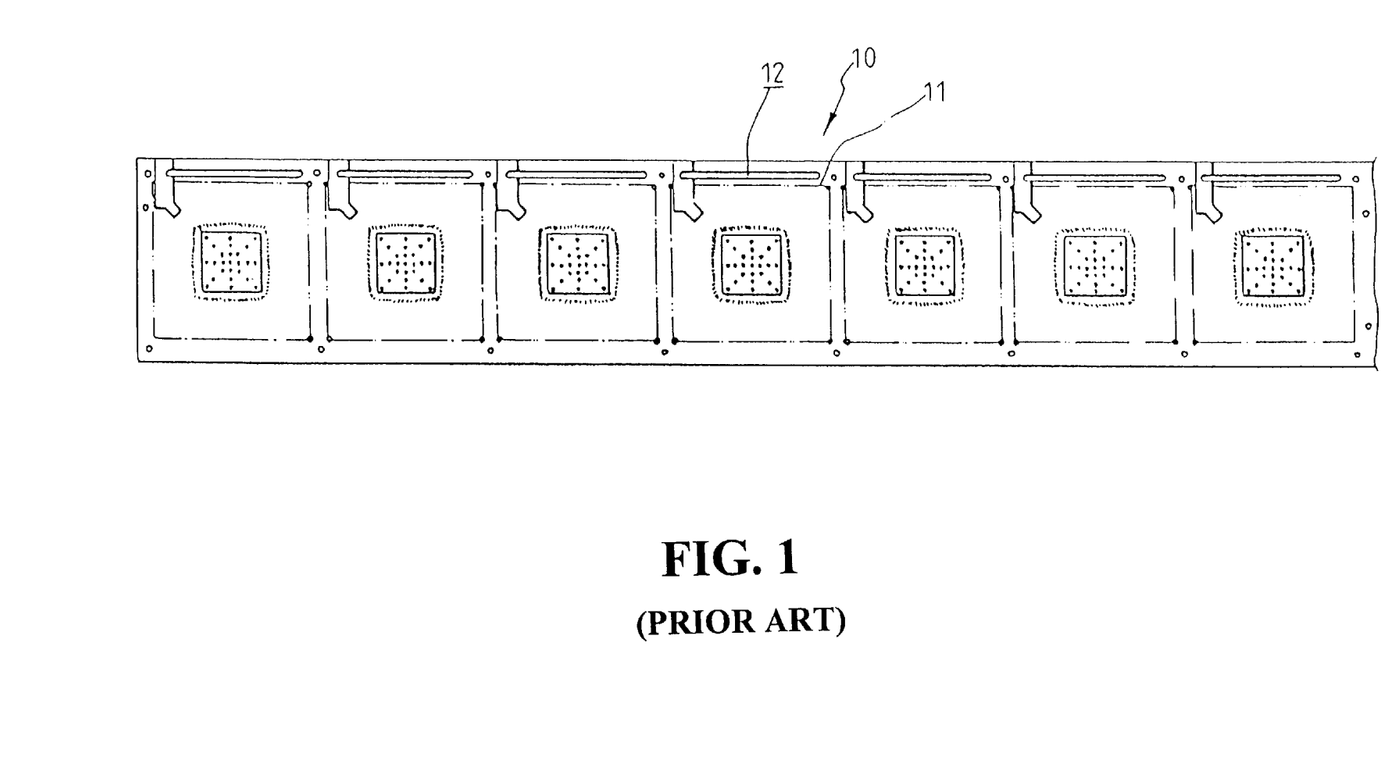
FIG. 1 shows a schematic diagram of a laminate plate.
Figure 2:
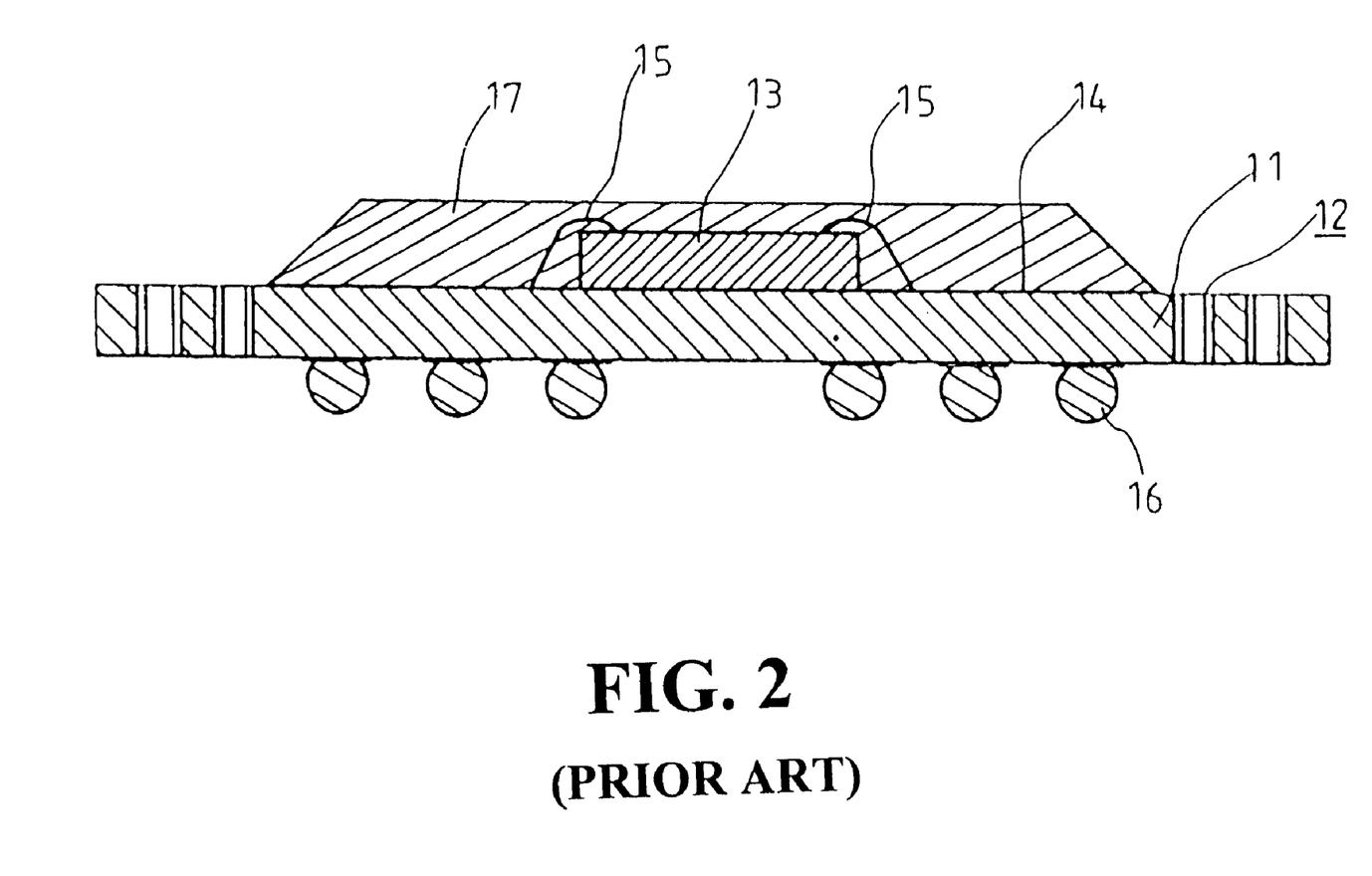
FIG. 2 shows a cross-sectional schematic diagram of an electronic device.

To increase the output and for the convenience of molding, a laminate plate 10 with a plurality of substrates 11, as shown in FIG. 1, is usually employed in the prior arts associated with molding process for electronic devices such as ICs. Each substrate 11 contains an electronic device package. There are several cutting troughs 12 between adjacent substrates, which facilitate the discrete substrates to be cut off after the molding process. There is a chip 13 located at the center area of each substrate. Several copper lines 14 surrounding the chip 13 on the substrate 10 are used to connect with the chip 13 by metallic lines 15. Finally, the substrate 11 undergoes the molding process by means of a suitable molding compound to form a molding body 17 enveloping the chip 13. A plurality of solder balls 16 are soldered on the back side of the substrate 10, as shown in FIG. 2.

Figure 3:
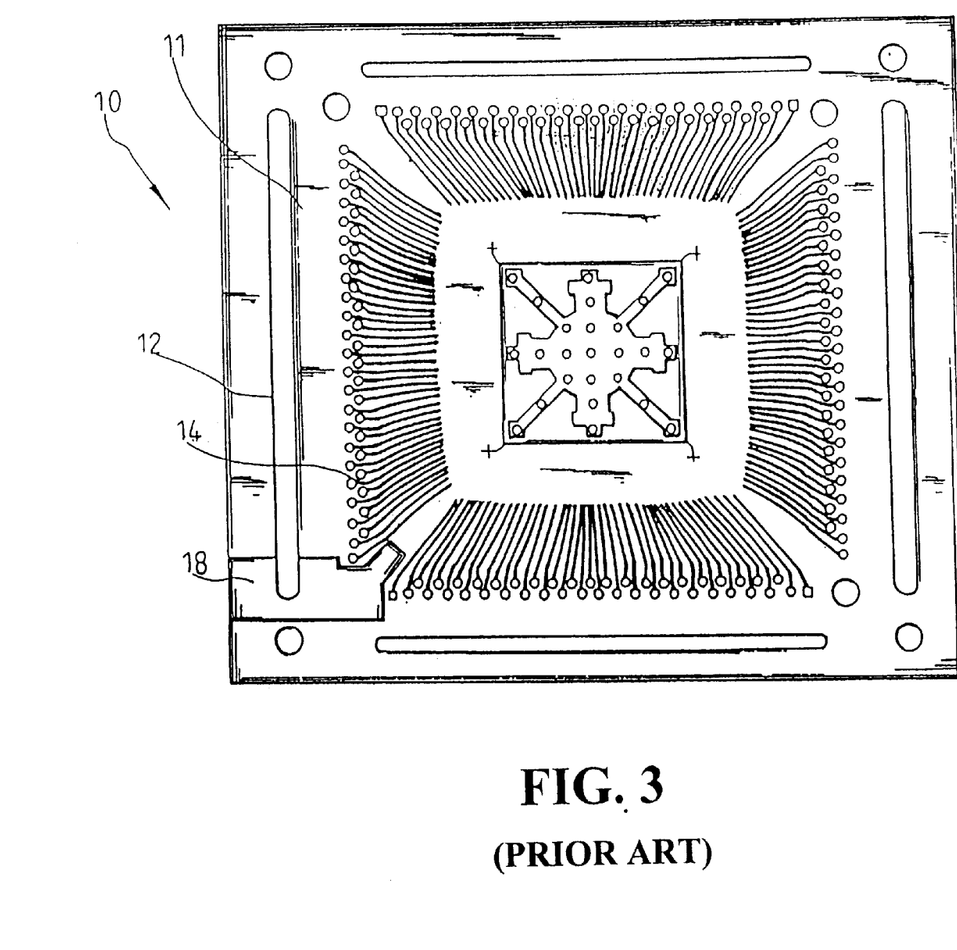
FIG. 3 illustrates a blowup diagram of the substrate on the laminate plate.
Figure 4:
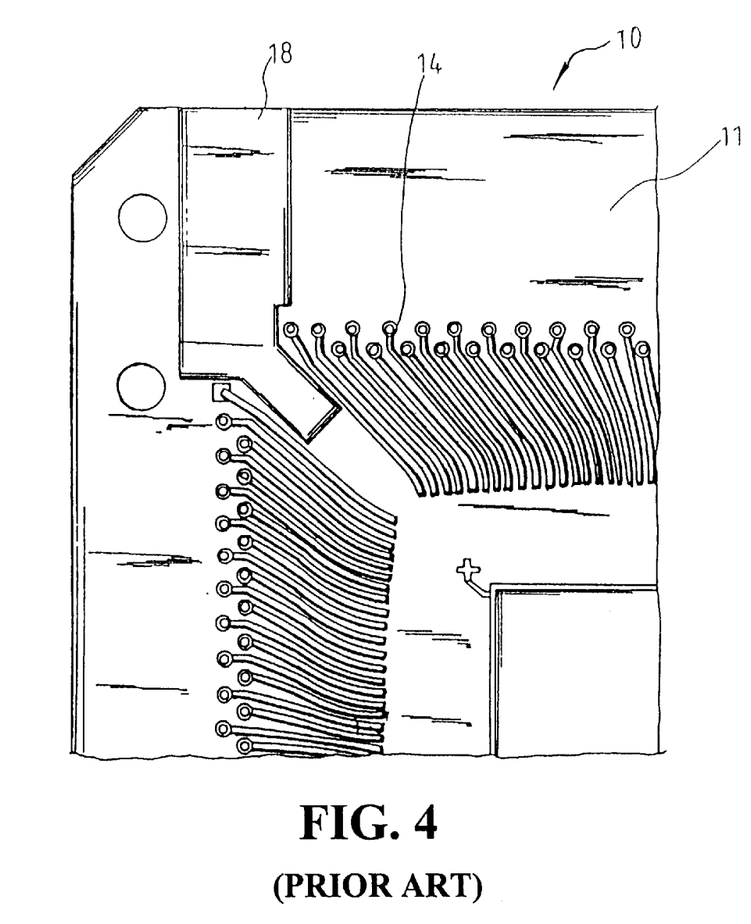
FIG. 4 illustrates a blowup diagram of the gold area of the substrate.

The above-mentioned process is similar to one of the well-known molding methods for assembling the laminate plate and the molding compound, and easily releasing the runner and gate from the laminate plate, as disclosed in U.S. Pat. No. 5,635,761. There is a gold area 18 in each substrate deeply passing through the copper lines 14 at a desired corner of the substrate 11 close to the first pin which is defined by the prior arts, as shown in FIGS. 3 and 4.

During the molding process, the molding compound spreads over the laminate plate 10 along the gold area 18 to form a runner (or gate) 20 and the molding body 17. The runner 20 will be released from the laminate plate after a curing process for the molding compound. The gold area 18 essentially has low adhesion to the molding compound but the laminate plate typically has high adhesion such that the runner 20 can be easily released due to the difference in the adhesion property. However, the conventional molding process has several disadvantages as follows:

a. Gold, which is used to implement the gold area on the laminate plate, is so expensive that the cost is very high.

b. The number of the output pins for the electronic device may be up to 64 or more than several hundreds. It is still difficult for the present technology to layout so many pins on the substrate. Due to the limited available area, each copper line 14 is designed to just be able to connect peripheral devices without further considering any electric effect resulting from the copper lines 14. The prior process requires a gold area to deeply pass into the copper lines 14 which occupy a portion of the available area of the substrate 11, and leads to the reduction of the number of the copper lines 14 as well as the increase in layout difficulty.

c. Although the gold area 18 has low adhesion to the molding compound, it is still not low enough to completely release the runner 20 from the laminate plate 10 without any damage to the molding body. Thus, the molding body is sometimes released from the laminate plate which results in great reduction of the yield rate. It may also be possible that some molding compound remaining on the junction area of the gold area 18 and the molding body to ruin the appearance of the electronic device after the releasing process.

Apparently, the prior art process can not avoid damage to the molding body during the releasing process. It has become more and more desirable to improve the molding process and to prevent the molding body from being damaged or released from the substrate so as to increase the yield rate.

SUMMARY OF THE INVENTION

The object of the present invention is to provide a molding process for easily releasing the runner or gate from the laminate plate. The area of the laminate plate designed to be covered with molding compound is cleaned in advance by appropriate physical and chemical cleaning process to enhance the adhesion, and the area to be covered by the runner or gate is protected from the cleaning process to maintain the original property of low adhesion for the laminate plate. The runner or gate can be easily released from the laminate plate without damaging the molding body after the molding and releasing process, and the yield of the electronic device is thus increased.

Another object of the present invention is to provide a molding process for marking on a suitable location to identify the first pin of the electronic device as in the prior arts, without occupying any available area of the laminate plate.

Other features and advantages of the present invention will become apparent after the following description which refers to the accompanying drawings.

DETAILED DESCRIPTION OF THE PREFERRED EMBODIMENTS

Figure 6:
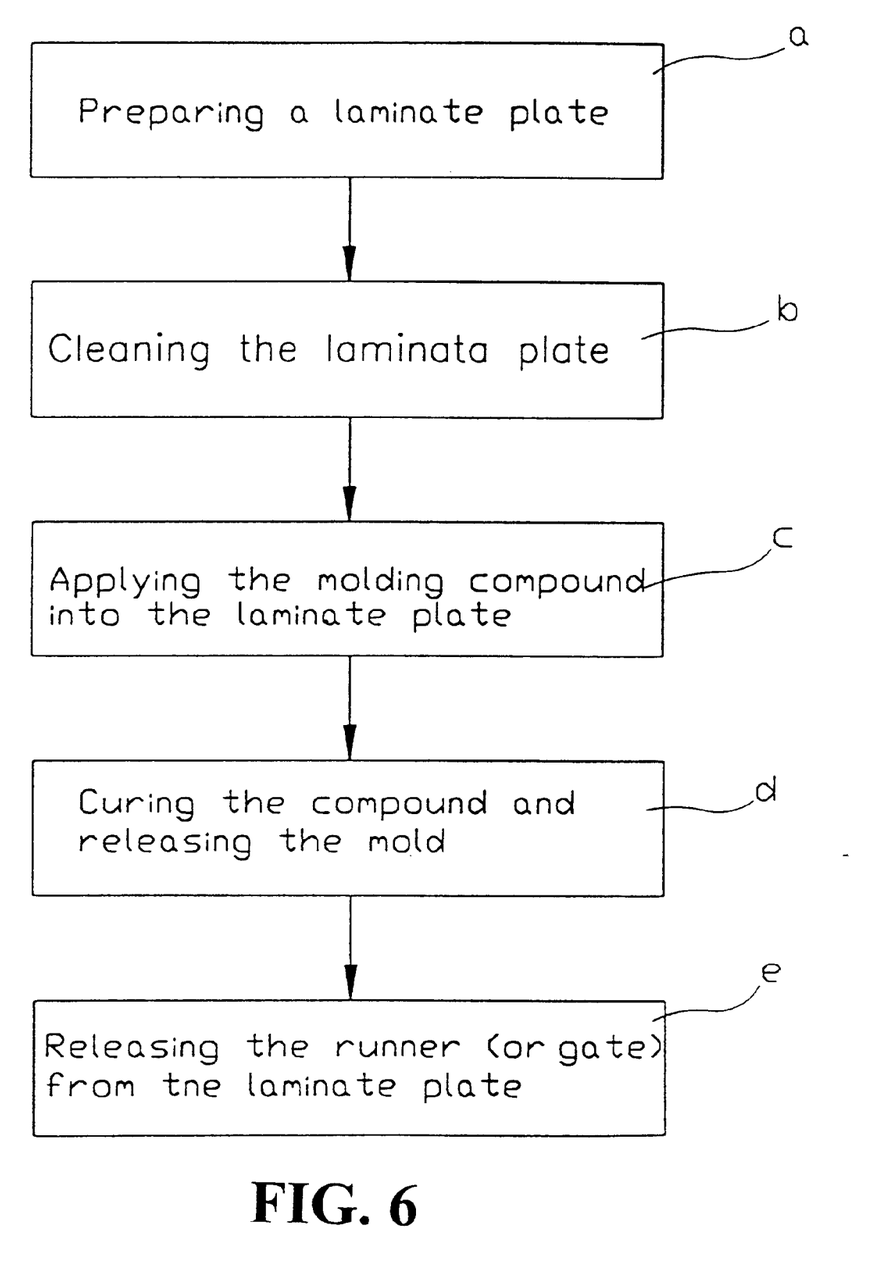
FIG. 6 illustrates a flowchart of the present invention.

FIG. 6 shows a flow chart of the process of this invention. The process of this invention includes the following steps:

a. Preparing a laminate plate.

b. Cleaning the laminate plate.

c. Applying the molding compound into the laminate plate.

d. Curing the compound and releasing the mold.

e. Releasing the runner (or gate) from the laminate plate.

Figure 7:
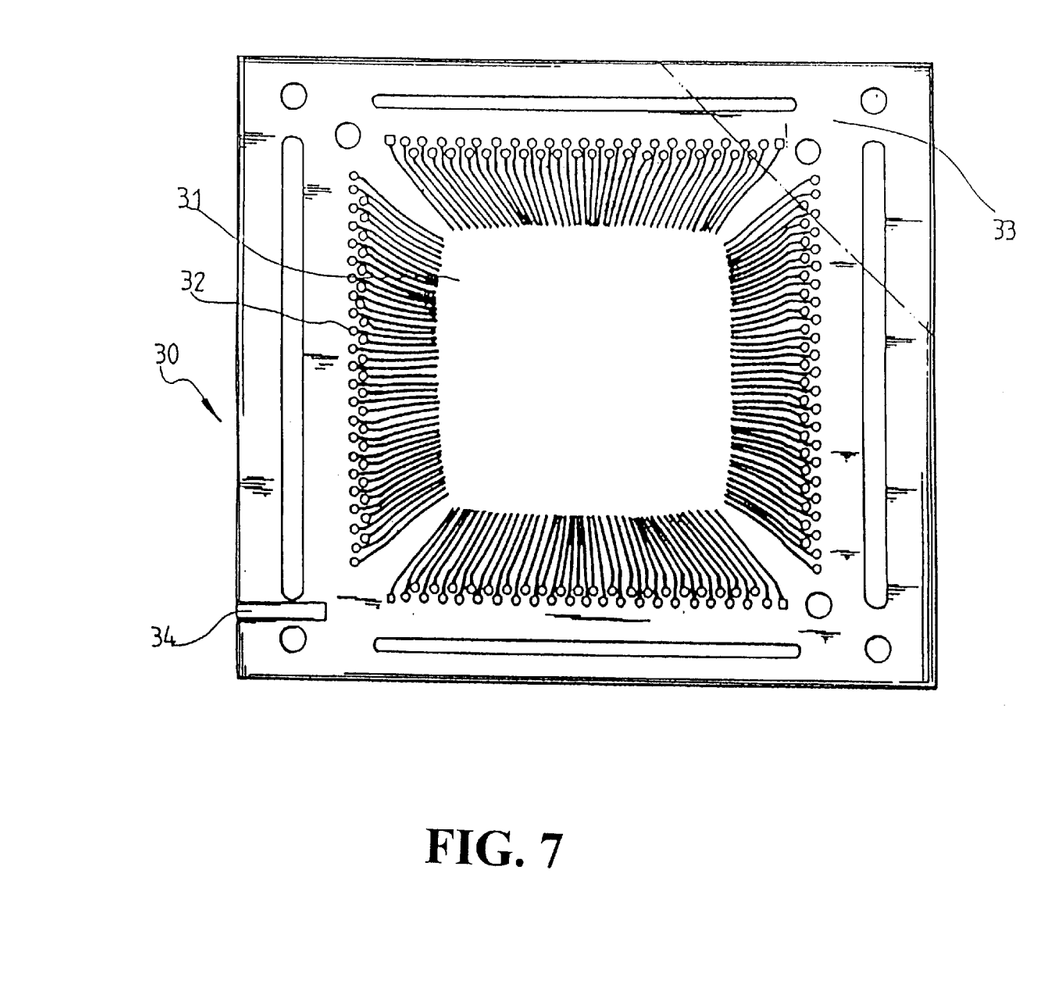
FIG. 7 shows a localized blowup diagram of the substrate on the laminate plate in the present invention.

As shown in FIG. 7, the present invention uses a laminate plate 30 that has very low adhesion to the molding compound. The area 31 of the laminate plate 30, which will be covered by the molding compound in the molding process, is first cleaned to increase the adhesion by the conventional process of plasma cleaning or ozone cleaning. The area 33 designed for the runner to pass through is located at the designated corner of each substrate and protected from being cleaned so that the original property of low adhesion is maintained, as shown in FIG. 7. The laminate plate having areas 31 and 33 is used to implement the molding process for electronic devices.

Figure 5:
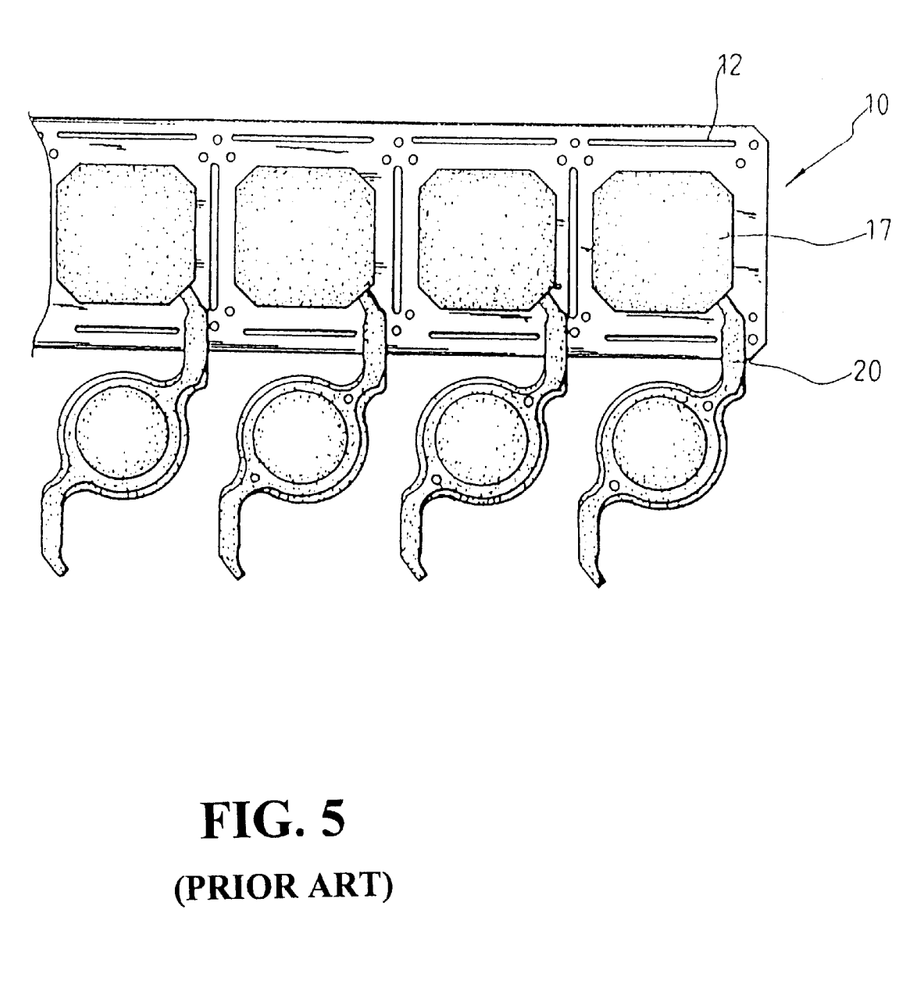
FIG. 5 shows the structure of the molding body and the runner or gate after the molding process.

The molding compound is heated up to about 175° C. to a melting state and then passed through the area 33 into the area 31 of the laminate plate 30 to form the runner (or gate) 20 and the molding body 17 after the curing process as shown in FIG. 5. The molding body is released from the mold and at the same time the runner 20 is released from the laminate plate 30. The area not cleaned essentially has low adhesion, so the molding compound can just adhere to and be released easily from the laminate plate 30 without any residue. Thus, the surface of the laminate plate 30 is kept intact and the molding body does not suffer from damage during the releasing process such that the yield of the electronic device is increased.

To avoid mismatching the output pins of an electronic device in use, the first pin of the electronic device is usually marked for easy identification with reference to the first pin of the copper lines on the laminate plate. The conventional molding process as discussed in the prior art requires a gold area near the first pin of the copper lines. Therefore, a suitable location on the gold area 18 is designated as a mark for identifying the first pin. The present invention also provides a mark 34 at the corner of the electronic device, as shown in FIG. 7, which can meet the conventional requirement for the purpose of easy identification and will not occupy any available area of the laminate plate 30 for layout.

The present invention has several advantages over the conventional approaches, including:

a. The gold area deeply passing through the copper lines as in the prior arts is no longer necessary for the present invention because the desired area to be covered with the molding compound is physically and chemically cleaned so as to increase the adhesion.

b. The area not cleaned still has low adhesion for easy releasing. The molding body will not suffer from any damage or be released from the laminate plate. Thus, the yield is greatly increased.

c. There is no molding compound remaining at the junction area of the molding body and the gold area, so the appearance of the electronic device is not degraded.

Furthermore, in the present invention, the molding process for the gold area 18 may also include two types of processes, non-electroplating and electroplating processes.

Figure 8A:
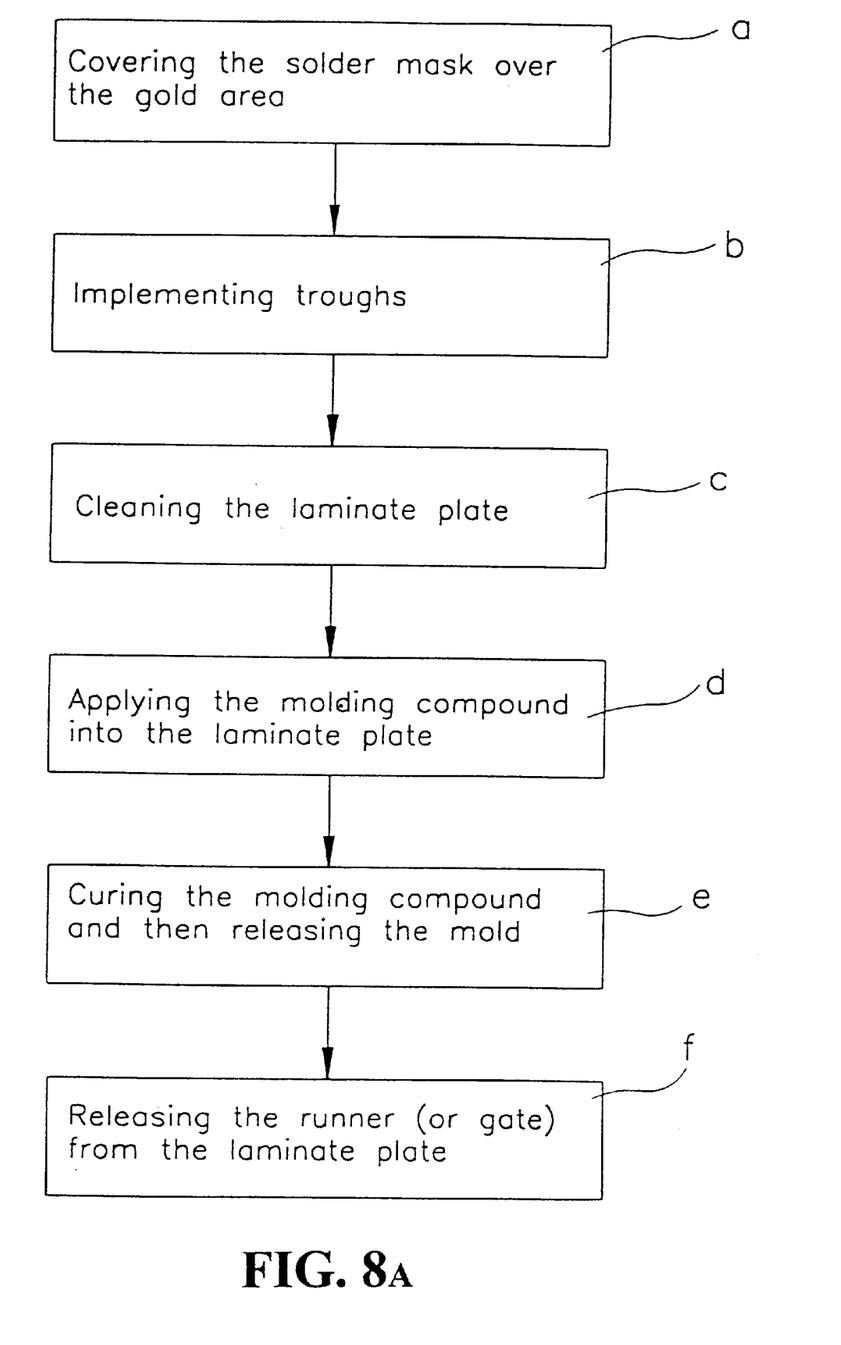
FIG. 8A illustrates a flowchart of an embodiment of the present invention without electroplating process.
Figure 9A:
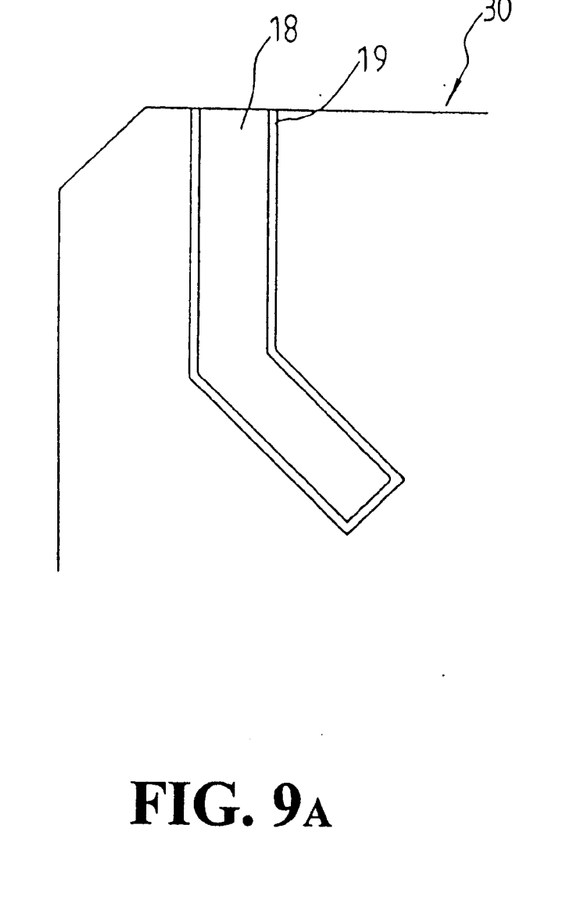
FIG. 9A shows a schematic diagram of the gold area in FIG. 8A.
Figure 9B:
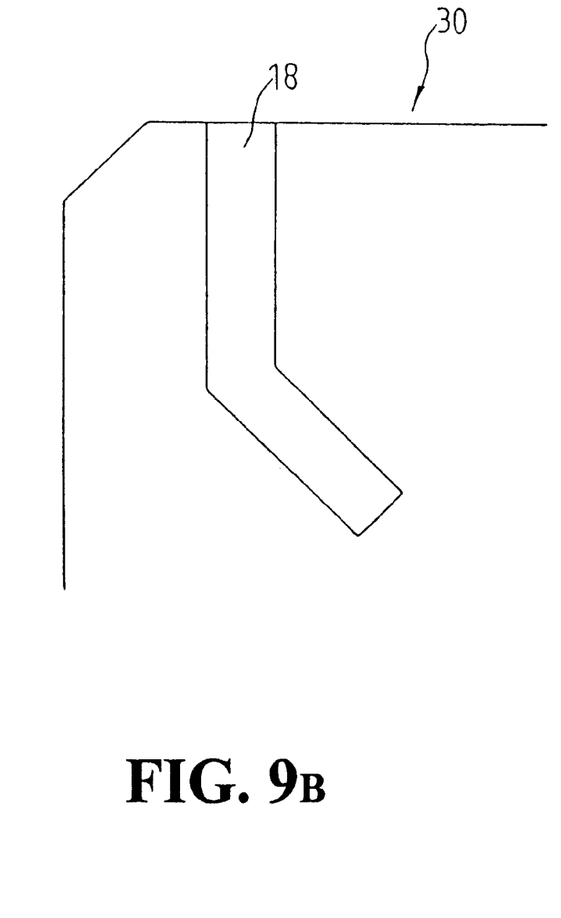
FIG. 9B shows a schematic diagram of the gold area in FIG. 8A after the releasing process.

With reference to FIG. 8A, the flowchart of a preferred embodiment in the present invention without electroplating process is illustrated. A solder mask is used to cover the gold area 18 which serves as a runner or gate in the molding process, and a trough 19 along the gold area 18, which is about 0.2 mm in width, is implemented as shown in FIG. 9A. The copper foil substrate under the trough 19 is exposed. The contact property of the solder mask and the molding compound is enhanced after the plasma cleaning and the molding process so that only the copper foil substrate in FIG. 9B under the gold area 18 is left after releasing the runner (or gate) because the solder mask on the gold area 18 is released along the trough 19.

In summary, the process as shown in the flow chart of FIG. 8A includes the steps as follows:

a. Covering the solder mask over the gold area.

b. Implementing troughs.

c. Cleaning the laminate plate.

d. Applying the molding compound into the laminate plate.

e. Curing the molding compound and then releasing the mold.

f. Releasing the runner (or gate) from the laminate plate.

The advantages of this embodiment are as follows:

a. It saves the amount of gold and reduces the cost.

b. The copper foil covered by the solder mask will not dissolve in the acid solution used in electroplating process. It avoids the pollution of the gold solution.

Figure 8B:
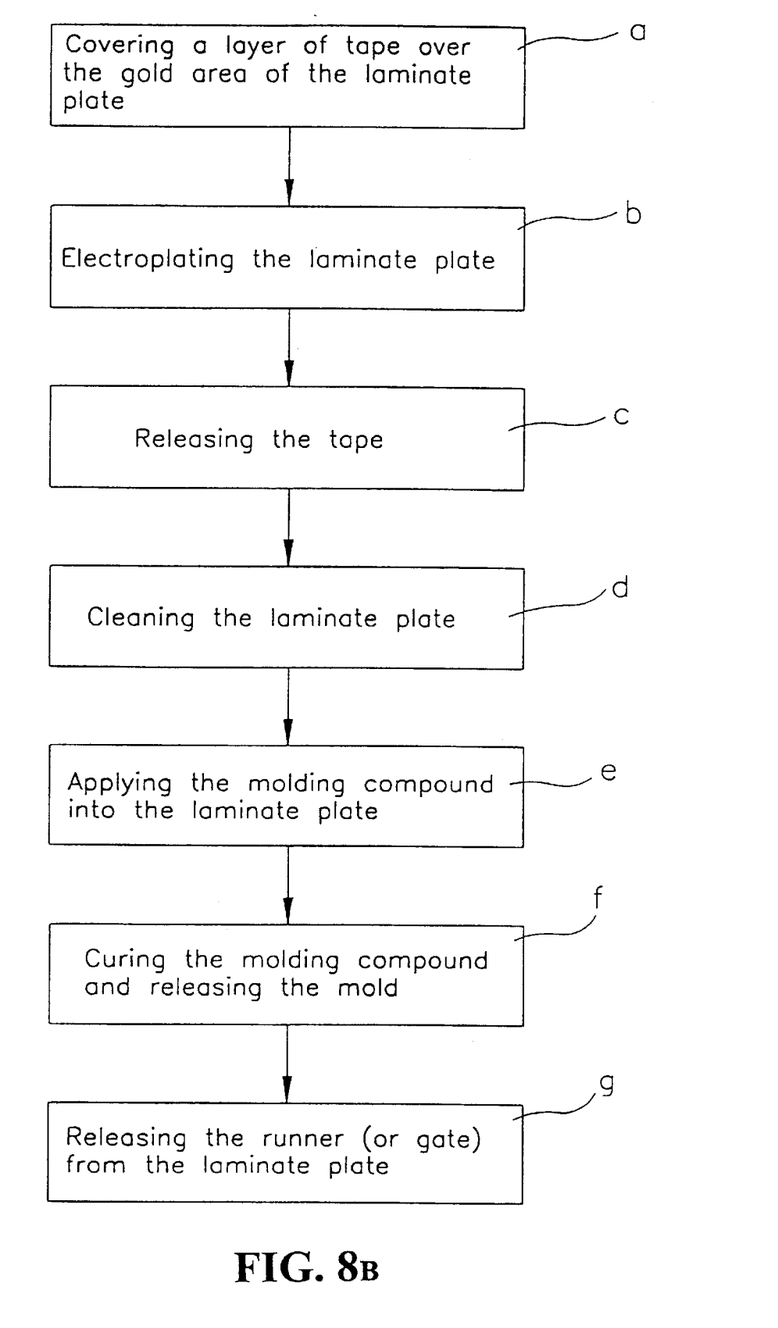
FIG. 8B illustrates a flowchart of another embodiment of the present invention without electroplating process.

With reference to FIG. 8B, the flowchart of another embodiment of the present invention is illustrated. The gold area is first covered with a layer of tape and then undergoes the electroplating process. The tape is released after the electroplating process, so the copper foil substrate under the gold area 18 is exposed. The adhesion of the gold area 18 is lower than the area cleaned so as to prevent the molding body from any damage and avoid being released off the laminate plate 30 in the releasing process after the molding compound is molded and cured.

In summary, the above process includes:

a. Covering a layer of tape over the gold area of the laminate plate b. Electroplating the laminate plate.

c. Removing the tape.

d. Cleaning the laminate plate.

e. Applying the molding compound into the laminate plate.

f. Curing the molding compound and releasing the mold.

g. Releasing the runner (or gate) from the laminate plate.

Figure 10:
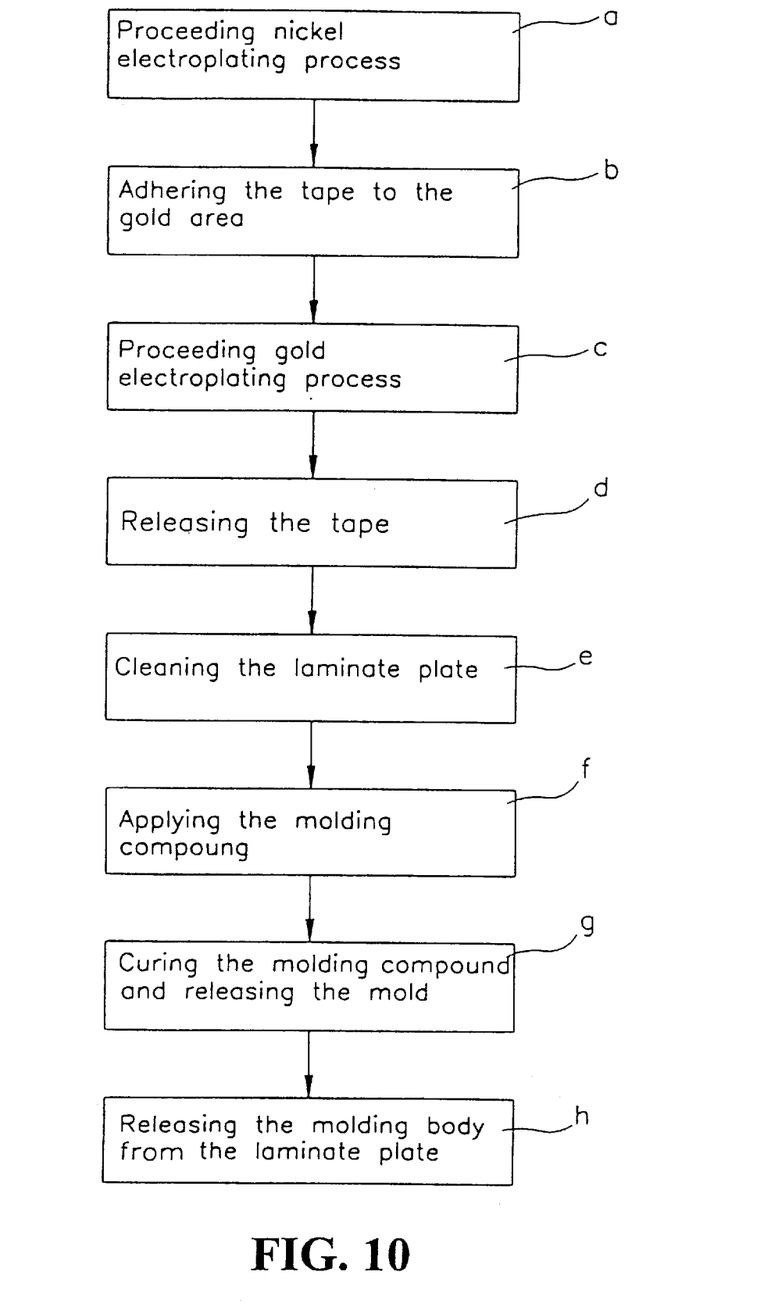
FIG. 10 illustrates a flowchart of an embodiment of the present invention employing electroplating process.

With reference to FIG. 10, the flowchart of another preferred embodiment of the present invention employing electroplating process is illustrated. The gold area 18 is covered with a layer of tape after the laminate plate 30 undergoes the nickel electroplating process. Then, the gold electroplating process is performed and the tape is removed such that only a layer of nickel remains on the gold area 18. After the curing process for the molding compound, the molding body will not suffer any damage in the releasing process because of the difference of adhesion between gold and nickel materials. Thus, the molding body will not be released from the laminate plate 30.

In summary, the above process includes:

a. Performing nickel electroplating process.

b. Adhering the tape to the gold area.

c. Performing gold electroplating process.

d. Removing the tape.

e. Cleaning the laminate plate.

f. Applying the molding compound.

g. Curing the molding compound and releasing the mold.

h. Releasing the molding body from the laminate plate.

There are several advantages over the prior arts, including:

a. Reducing the amount of gold and the cost.

b. Improving the appearance of the resulting electronic device because nickel is easier to oxidize and the oxide has more uniform color.

From the above-mentioned description, the present invention indeed overcomes the disadvantages of the prior arts associated with releasing the molding body from the laminate plate.

Although only the preferred embodiments of this invention were shown and described in the above description, it is requested that any modification or combination that comes within the spirit of this invention be protected.

What is claimed is:

1. A process for releasing a molding runner from a laminate plate having an electronic device built thereon after a molding process, comprising the steps of:

preparing a laminate plate having a device substrate placed thereon;

covering an area designated for a molding runner on said laminate plate using a tape to protect said designated area from being electroplated;

performing an electroplating process and then removing said tape for exposing a copper foil substrate area under said protected area;

cleaning said laminate plate;

applying a molding compound through said molding runner into a mold placed on said laminate plate;

curing said molding compound for forming a molding body and removing said mold; and releasing said molding runner;

wherein said protected area having substantially low adhesion property for easily releasing said molding runner.

2. A process for releasing a molding runner from a laminate plate having an electronic device built thereon after a molding process, comprising the steps of:

preparing a laminate plate having a device substrate placed thereon;

performing a nickel electroplating process; covering an area designated for a molding runner on said laminate plate using a tape to protect said designated area from being cleaned;

performing a gold electroplating process and then removing said tape for exposing a nickel electroplated area under said protected area;

cleaning said laminate plate;

applying a molding compound through said molding runner into a mold placed on said laminate plate;

curing said molding compound for forming a molding body and removing said mold; and releasing said molding runner;

wherein said protected area having substantially low adhesion property for easily releasing said molding runner.

* * * * *